(12) United States Patent
Schindler

(10) Patent No.: US 6,618,935 B1
(45) Date of Patent: Sep. 16, 2003

(54) METHOD FOR EQUIPPING SUBSTRATES WITH COMPONENTS

(75) Inventor: Horst Schindler, Hoehenkirchen-Siegertsbr. (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/540,561

(22) Filed: Mar. 31, 2000

(30) Foreign Application Priority Data

Apr. 30, 1999 (DE) .......................... 199 19 916

(51) Int. Cl.⁷ .............................. H05K 3/30
(52) U.S. Cl. ...................... 29/832; 29/740; 209/560
(58) Field of Search .................... 29/832, 740, 743; 209/571, 573, 560, 561, 905, 919

(56) References Cited

U.S. PATENT DOCUMENTS

| | | | | |
|---|---|---|---|---|
| 5,862,587 A | * | 1/1999 | Higashi ........................ | 29/740 |
| 5,909,674 A | | 6/1999 | Schaffer et al. | |
| 6,189,207 B1 | * | 2/2001 | Nagae ......................... | 29/740 |
| 6,223,428 B1 | * | 5/2001 | Nonaka et al. ............... | 29/740 |

FOREIGN PATENT DOCUMENTS

| | | |
|---|---|---|
| EP | 0 838 992 | 4/1998 |
| GB | 2 173 426 | 10/1986 |
| WO | WO 98/37744 | 8/1998 |

* cited by examiner

*Primary Examiner*—Richard Chang
(74) *Attorney, Agent, or Firm*—Harness, Dickey & Pierce, P.L.C.

(57) ABSTRACT

A method for increasing equipping performance of a process line includes providing automatic equipping units to equip substrates with components and an equipping program. A theoretical program is determined before the equipping process starts. The goal is an optimally high equipping performance based on a theoretical time behavior of the individual automatic equipping units. Observers measure the actual time behavior of the automatic equipping units and are provided in control devices of automatic equipping units arranged in the line. An updated equipping program, with which the individual automatic equipping units or, respectively, the entire line of automatic equipping units are operated, is determined with the assistance of the measured actual time behavior. A new allocation of components to be equipped at equipping locations ensues according to the updated equipping program.

8 Claims, 3 Drawing Sheets

METHOD FOR EQUIPPING SUBSTRATES WITH COMPONENTS

BACKGROUND OF THE INVENTION

The invention is generally directed to a method for equipping substrates with components, and more particularly to a method for positioning components on a substrate using equipping heads according to an actual time behavior program.

When equipping substrates, such as printed circuit boards with components, the components are taken from delivery units with the assistance of equipping heads and are positioned onto a predetermined position on the substrate by the equipping head. Optimally, many components per time unit should thereby be positioned on the substrates for a high equipping performance (equipped substrates per time unit).

International patent document no. WO 98/37744 discloses a means to achieve high equipping performance for manufacturing electrical assemblies that comprises two linear longitudinal guides in a central region that are in close proximity and parallel to one another. Carriages are correspondingly movable relative to the guides. These carriages comprise cantilevered transverse carriers for equipping heads that are directed away from one another toward the outside. Two separate processing locations result and are capable of being operated independently of one another. As a result, equipping performance of the device is enhanced.

For an even higher equipping performance, automatic equipping units are juxtaposed in the line. The different automatic equipping units each include different supplies of component types and can be specifically adapted for the respective component types. The different automatic equipping units exhibit a characteristic time behavior that includes the time required for picking up the components from the delivery units, transporting of the components to the desired position on the substrate, and placing of the components on the substrate. This time behavior is considered the same for all automatic equipping units of the same type in a first approximation. An equipping program that optimizes the paths of the equipping head in such a way that many components can optimally be placed in an optimally short time is produced with the assistance of this approximated time behavior.

This so-called fitting optimization, however, does not take the real time behavior of the automatic equipping unit into consideration. As a result, an incorrect work load of the individual equipping locations in the line occurs. Moreover, unpredictable interruptions can occur in the equipping line, such as a component that is not resupplied in time or, respectively, a conveyor that is down due to a malfunction, such as a malfunctioning equipping process or an entire station malfunction. In these cases, a standstill of the entire line occurs, even though only one station is faulty.

SUMMARY OF THE INVENTION

One object of the present invention is to provide a method for increasing the equipping performance or output when utilizing a plurality of equipping locations along a processing line. Another object of the present invention is to provide a method for increasing the equipping performance of an assembly line for placing components on a substrate by accounting for the real time behavior of automatic equipping units used along the assembly line equipping locations.

These and other objects, features and advantages are provided by a method of the invention that in one embodiment includes providing at least two equipping locations for equipping individual substrates with components. The components are respectively taken from delivery units by equipping heads and are placed onto substrates that are allocated to the at least two equipping locations. The equipping heads are controlled by a predetermined equipping program that includes allocation for each of the equipping locations and the components to be placed at each of the respective locations. A time for equipping a substrate is identified during the equipping process controlled by the predetermined program. The identified equipping time is compared to a predetermined time contained in the program and a time difference is calculated. The time difference is then compared to a predetermined time span that is used to generate an updated equipping program that allocates between each of the equipping locations and the components to be placed on the substrates. The updated equipping program accounts for the time difference. The equipping process for further substrates is then subsequently controlled according to the updated equipping program instead of the original predetermined equipping program.

According to the invention, the equipping program is monitored during operation, and an improved or updated equipping program is utilized, given the occurrence of bottle necks. As a result of the constant adaptation of the equipping program to the real time behavior of the equipping heads, the real time behavior of the machine is taken into consideration and an emergency operation of the line is enabled as well, given the occurrence of unpredicted faults.

In one embodiment of the method, the updated equipping program is checked anew in that the time actually required for the equipping process is measured. Whether the performance improvement that is initially only determined theoretically is in fact achieved is thereby checked. Given a known deviation of the theoretical from the real behavior of the equipping heads, one can achieve the goal of shortening the process time in fact, instead of the time becoming longer and longer in reality.

In one embodiment of the method, the real time behavior of the equipping locations is advantageously compared to the theoretically predetermined model. When the real time behavior deviates from the theoretical time behavior, an improved program is determined taking the realtime behavior into consideration and is utilized for the next equipping processes.

In one embodiment, the method can be utilized both for automatic equipping units wherein at least two equipping locations are provided as well as for lines wherein a plurality of automatic equipping units are arranged following one another.

For checking which components are placed by which machine, it is advantageously provided according to another embodiment of the invention that information about the components placed on the substrate at the respective equipping locations is stored.

The display of information for an operator according to a further embodiment advantageously assures that performance improvements that arise by re-equipping delivery units are also realized.

These and other objects, features and advantages of the present invention will become apparent upon a further review of the detailed description and accompanying drawings provided herein. Changes and modifications can be made to the embodiments disclosed. The illustrated embodiments are provided herein in order to illustrate aspects of the present invention and not intended in any way to limit the scope of the invention.

BRIEF DESCRIPTION OF THE DRAWINGS

The invention is explained in greater detail on the basis of the exemplary embodiments shown in the Figures, wherein.

DESCRIPTION OF THE PREFERRED EMBODIMENTS

Figure 1:
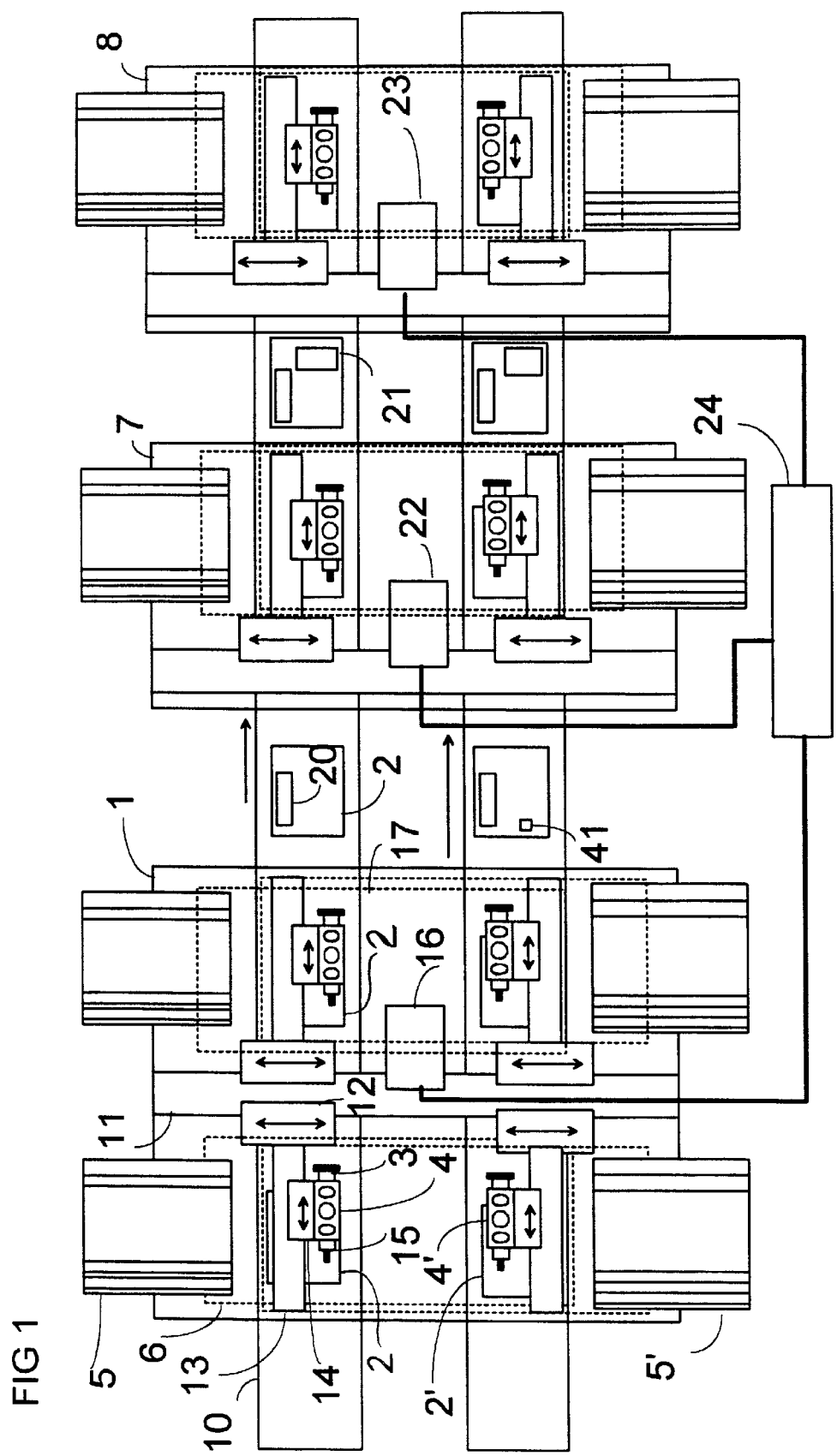
FIG. 1 shows a schematic plan view onto a line composed of three automatic equipping units each having, respectively, two equipping locations.

FIG. 1 schematically shows a plan view of a process line composed of three automatic equipping units 1, 7 and 8 whereby each individual automatic equipping unit 1, 7 and 8 respectively comprises two equipping locations 6 and 17. The functioning of the automatic equipping units 1, 7 and 8 is presented by way of example herein by describing in detail only the first automatic equipping unit 1 residing farthest toward the left in FIG. 1. The functioning of the further automatic equipping units corresponds to the description provided for unit 1.

With the assistance of a first automatic equipping unit 1, a substrate 2, particularly a printed circuit board, is equipped with components 3. For this purpose, an equipping head 6 takes the components 3 from a delivery unit 5, moves the components 3 into the placement position above the substrate 2, and places the components 3 on the substrate 2 in a predetermined position. What is referred to as a turret head is thereby shown as equipping head 4 by way of example in FIG. 1. The equipping head 4 has a plurality of suction pipettes 15 along its circumference that hold the components 3 at the equipping head 4 with a vacuum.

For moving the equipping head 4 parallel to the surface of the substrate 2, a first rail 11 at which a first carriage 12 moves is provided. A second rail 13 is secured relative to the first carriage 12 and at which a second carriage 14 moves is also provided. The equipping head 4 is connected to the second carriage 14. The equipping head 4 is capable of reaching every position on the substrate 2 as well as the positions of the delivery unit 5. This area that can be reached by the equipping head 4 is referred to below as first equipping location 6.

The movement of the equipping head 4 is controlled via a first control unit 16. Further, a second equipping location 17 having exactly the same structure as the location 6 is provided at the first automatic equipping unit, so that two substrates 2 can be processed in parallel. Two substrates 2 can thereby be identically equipped prior to subsequently being further-conveyed. However, it is also provided that the substrates 2 pass through both equipping locations 6 and 17 and are usually equipped with a variety of different components 3. After a certain component spectrum has been placed down on the substrates 2 with the assistance of the first automatic equipping unit 1, for example in a first equipped substrate region 20, the substrate 2 is further-conveyed toward the right to the second automatic equipping unit 7 by a conveyor 10. A further equipping location is provided at the unit 7 so that a second substrate region, for example region 21, can then be equipped. The second automatic equipping unit 7 is controlled by a second control unit 22. Additionally, a third automatic equipping unit 8 having a third control unit 23 is shown, the function thereof being analogous.

The first control unit 16, the second control unit 22 and the third control unit 23 are connected to a line control unit 24. Further automatic equipping units can be provided in the line, either upstream or downstream of the units 1, 7 and 8 shown in FIG. 1. Further, automatic equipping units can also be provided that, for example, comprise other equipping heads instead of the turret head and that, for example, comprise only one suction pipette 15. FIG. 1 thereby shows automatic equipping units 1, 7 and 8 that can work simultaneously at two conveyors 10 arranged neighboring one another. This arrangement can optimize the process so that many substrates 2 can be simultaneously processed given minimum space requirements.

Additionally, the equipping area 6 of the equipping head 4 can be extended onto the substrate 2' that is located on the second conveyor. As a result, the equipping head 4 can equip the substrate 2' located thereat with components from the delivery device 5'. Alternatively, a further equipping head 4' can pick up components from the further delivery devices 5' and place them on the substrate 2'. In this case, the inventive method can be employed for determining the equipping performance at the two equipping locations of the equipping head 4 and of the further equipping head 4'.

Figure 2:
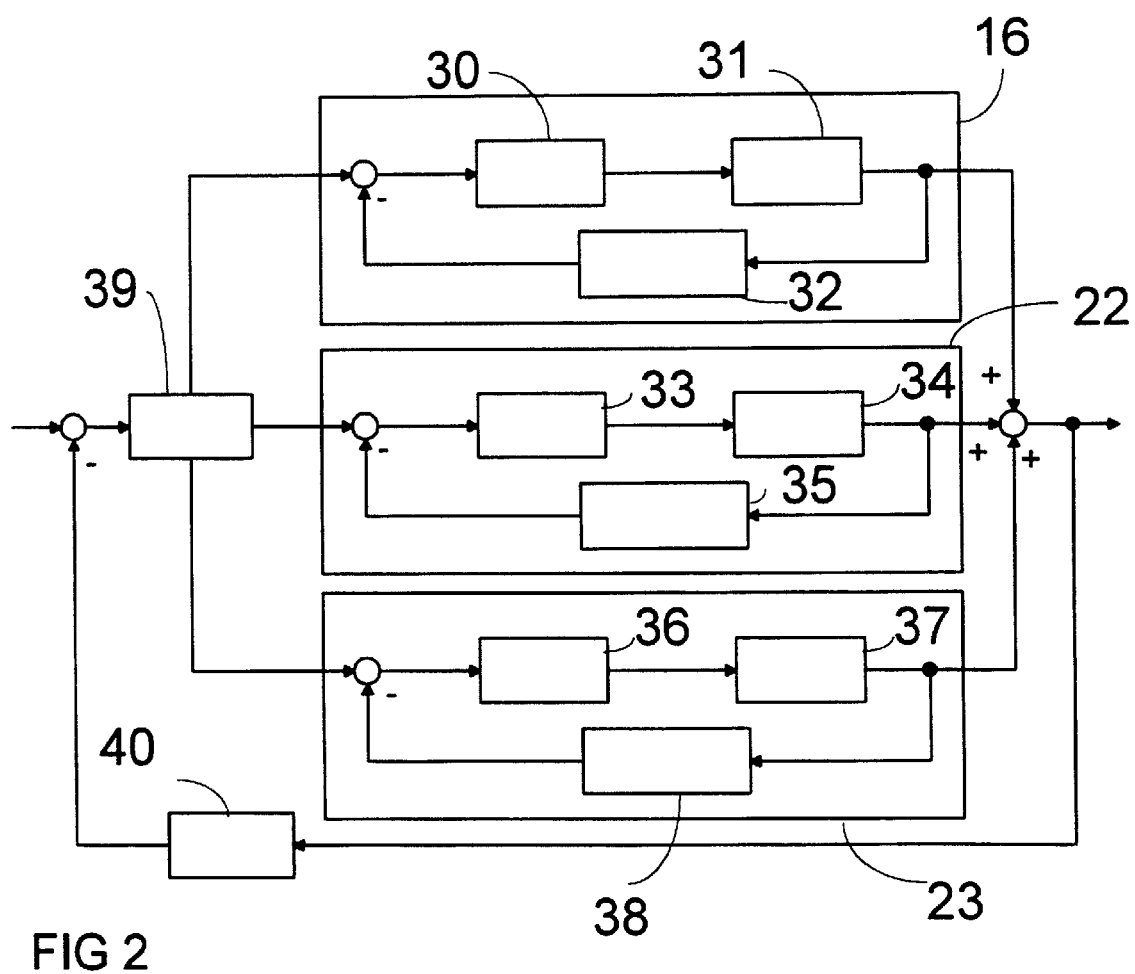
FIG. 2 shows the control circuits for the arrangement according to FIG. 1.

FIG. 2 shows the control circuits of the arrangement of FIG. 1. The first control unit 16, the second control unit 22 and the third control unit 23 thereby each respectively include a regulator 30, 33 and 36, a controlled path 31, 34 and 37, and an observer 32, 35 and 38. When, for example, the observer 32 of the first control unit finds that the two equipping locations 6 and 17 have different workloads, the regulator 30 of the first control unit will transmit a corresponding signal output to the controlled path 31. This signal includes a modified or updated equipping program that allocates the components to be equipped and the equipping locations to one another. An observer of the line control unit 40 is provided for the overall line performance. This observer forwards its information to a regulator 39 of the line control unit. The observer 40 of the line control unit provides information that is taken in to consideration by the regulator 39, resulting in an improved and updated equipping program.

Figure 3:
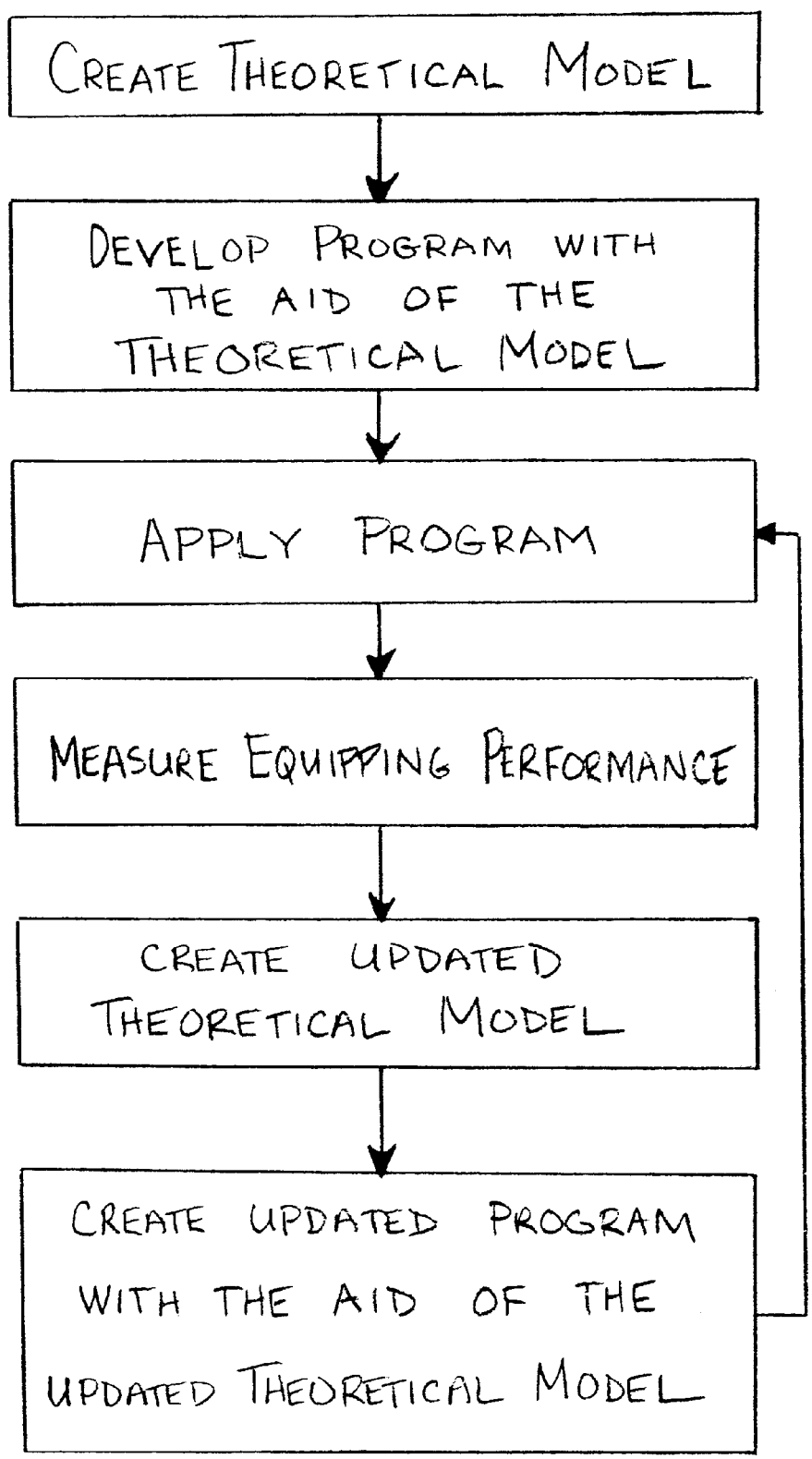
FIG. 3 shows a flow chart for the executed sequence of the method.

The inventive method is explained on the basis of the flow chart of FIG. 3. A theoretical model is first produced on the basis of theoretical time behavior of the automatic equipping units 1, 7 and 8. When a substrate is to be equipped with a specific quantity of components of a specific component spectrum, then the individual components, the component types, and the individual positions at which the components are to be placed on the substrate are processed into an equipping program with the assistance of the theoretical model. The different equipping locations 6 and 17 optimally utilize this equipping program insofar as possible in order to optimally equip many substrates 2 in an optimally short time. Which components 2 that must thereby be kept on hand in the delivery units 5 and respectively allocated to the automatic equipping units 1, 7 and 8 is thereby also prescribed.

The equipping performance that is in fact achieved is measured while this program is being applied. In general, the real time behavior of the automatic equipping units 1, 7 and 8 will deviate from the theoretical time behavior. The deviations between the theoretical and actual behavior or performance are identified with the assistance of the observers 32, 35, 38 and 40, and an adapted or updated theoretical model of the line is produced. This adapted or updated theoretical model will then generally also lead to an adapted or updated equipping program in which the actual time behavior of the individual automatic equipping units 1, 7 and 8 is taken into consideration. This adapted or updated equipping program is then applied, leading to a higher equipping performance for the line.

A theoretical model for a duration of individual work steps of the equipping heads can be created. The equipping program can then be determined based upon the theoretical model. From there, a real or actual duration of the individual work steps of the equipping heads is identified during measurement of the equipping time. The theoretical model can then be adapted based on the identified real or actual duration. Optionally, the updated equipping program can be updated according to the adapted theoretical model.

For changing the allocation between components to be equipped and the equipping locations 6 and 17, it is necessary that the components 3 are on hand in suitable quantities in the individual delivery units 5 of the different automatic equipping units 1, 7 and 8 so that the allocation can be changed. When it is not possible to keep multiples of the different components 3 on hand due to the great variety of components, then it is indicated to an operator of the line that an increased equipping performance would result from a refitting of the components. The operator can then manually undertake refitting the units 5 and can thus achieve a better result or performance.

It is desirable that a later check can be carried out for quality control as to which particular automatic equipping unit 1, 7 or 8 has equipped which particular components 3. To accomplish this quality check, it is provided that the individual substrates 2 contain information stores 41 wherein each individual automatic equipping unit 1, 7 and 8 stores which of the components 3 were equipped at each respective automatic equipping unit. An autonomous memory unit that can be wirelessly written and read can thereby serve as information store 41 (often referred to as a "tag").

When a delivery unit 5 at an equipping location 6 or 17 goes down, the regulator 39 of the line control unit will have the component 3 otherwise supplied via this malfunctioning delivery unit 5 taken over by a different equipping head 4 at a different equipping location 6 or 17. When an entire automatic equipping unit 1, 7 or 8 malfunctions, the entire equipping content of this automatic equipping unit is taken over by one of the other automatic equipping units.

Changes and modifications can be made to the embodiments disclosed and described herein. These changes and modifications are intended to fall within the scope of the present invention. The disclosed embodiments are provided to illustrate aspects of the present invention and not in order to limit the scope of the invention. The scope of the present invention is intended to be limited only by the scope of the appended claim.

I claim:

1. A method for equipping substrates with components, the method comprising the steps of:

providing at least two equipping locations, each including a plurality of components held in a delivery unit and an equipping head for taking the plurality of components from the delivery unit for placement onto a substrate;

creating a theoretical model for operation of the equipping heads;

determining an equipping program on the basis of the theoretical model;

controlling each of the equipping heads with the equipping program, whereby the program allocates equipping locations and components to be placed on a substrate at the respective equipping locations;

identifying an equipping time during an equipping process controlled by the equipping program;

measuring an actual equipping time of the equipping heads;

adapting the theoretical model on the basis of the measured actual equipping time;

comparing the actual equipping time to a time stored in the equipping program and calculating a time difference between the stored time and the actual equipping time;

comparing the calculated time difference to a time span stored in the equipping program;

deriving an updated equipping program that allocates between the equipping locations and components to be placed at the respective equipping locations, wherein the updated equipping program is modified compared to the equipping program according to the time difference; and subsequently controlling the equipping process for further substrates according to the updated equipping program.

2. The method for equipping substrates according to claim 1, further comprising the steps of:

further updating the updated equipping program according to the adapted theoretical model.

3. The method for equipping substrates according to claim 1, further comprising the steps of:

creating a theoretical model for a duration of individual work steps of the equipping heads;

determining the predetermined equipping program on the basis of the theoretical model;

identifying a read duration of the individual work steps of the equipping heads during measurement of the equipping time;

adapting the theoretical model on the basis of the identified real duration; and further updating the updated equipping program according to the adapted theoretical model.

4. The method for equipping substrates according to claim 1, wherein at least two equipping locations are provided in one automatic equipping unit.

5. The method for equipping substrates according to claim 1, wherein the at least two equipping locations are provided in different automatic equipping units arranged in a process line.

6. The method for equipping substrates according to claim 1, wherein information about the components actually placed at the respective equipping locations is stored on the substrate.

7. The method for equipping substrates according to claim 1, wherein each delivery unit is allocated to only one equipping location.

8. The method for equipping substrates according to claim 1, further comprising the steps of:

displaying information for an operator; and refitting components from one equipping location onto another equipping location in order to enable the control by the updated equipping program when the displayed information indicates a problem with one equipping location.

* * * * *